United States Patent [19]
Allen et al.

[11] Patent Number: 6,090,673
[45] Date of Patent: Jul. 18, 2000

[54] DEVICE CONTACT STRUCTURE AND METHOD FOR FABRICATING SAME

[75] Inventors: Archibald J. Allen, Shelburne; Toshiharu Furukawa; Edward F. O'Neil, both of Essex Junction; Mark C. Hakey, Milton; Roger A. Verhelst, Colchester; David V. Horak, Essex Junction, all of Vt.

[73] Assignee: International Business Machines Corporation, Armonk, N.Y.

[21] Appl. No.: 09/175,304

[22] Filed: Oct. 20, 1998

[51] Int. Cl.[7] ..................... H01L 21/336; H01L 21/3205
[52] U.S. Cl. ..................... 438/301; 438/303; 438/586; 438/655
[58] Field of Search ..................... 438/303, 305, 438/592, 595, 597, 655, 664, 586, 556, 301, 683

[56] References Cited

U.S. PATENT DOCUMENTS

| | | |
|---|---|---|
| 3,700,981 | 10/1972 | Masuhara et al. . |
| 4,034,243 | 7/1977 | Love et al. . |
| 4,305,200 | 12/1981 | Fu et al. . |
| 4,348,746 | 9/1982 | Okabayashi et al. . |
| 5,121,174 | 6/1992 | Forgerson, II et al. . |
| 5,206,532 | 4/1993 | Roberts . |
| 5,474,948 | 12/1995 | Yamazaki . |
| 5,521,416 | 5/1996 | Matsuoka et al. . |
| 5,541,427 | 7/1996 | Chappell et al. . |
| 5,602,055 | 2/1997 | Nicholls et al. ..................... 437/192 |
| 5,620,912 | 4/1997 | Hwang et al. ..................... 438/301 |
| 5,620,919 | 4/1997 | Godinho et al. . |
| 5,631,484 | 5/1997 | Tsoi et al. . |
| 5,663,589 | 9/1997 | Saitoh et al. . |
| 5,770,507 | 6/1998 | Chen et al. ..................... 438/305 |
| 5,851,890 | 12/1998 | Tsai et al. ..................... 438/303 |
| 5,885,890 | 3/1999 | Dennison ..................... 438/597 |
| 5,895,269 | 4/1999 | Wang et al. ..................... 438/675 |
| 5,953,614 | 9/1999 | Liu et al. ..................... 438/303 |

OTHER PUBLICATIONS

"Fabricating one Semiconductor contact stud borderless to another" IBM Technical Disclosure Bulletin vol. 34 No. 4B Sep. 1991.

*Primary Examiner*—Richard Elms
*Assistant Examiner*—Michael S. Lebentritt
*Attorney, Agent, or Firm*—Schmeiser, Olsen & Watts; Eugene I. Shkurko

[57] ABSTRACT

The present invention overcomes the difficulties found in the background art by providing a direct low resistive contact between devices on a semiconductor chip without excessive current leakage. Current leakage is prevented in the preferred design by using silicon on insulator (SOI) construction for the chip. By constructing the direct contact over an insulator, such as silicon dioxide, current leakage is minimized. The preferred embodiment uses silicide to connect a polysilicon gate to a doped region of the substrate. An alternative embodiment of the present invention provides for the use of conductive studs to electrically connect devices. An increased density of approximately twenty percent may be realized using the present invention.

15 Claims, 13 Drawing Sheets

DEVICE CONTACT STRUCTURE AND METHOD FOR FABRICATING SAME

BACKGROUND OF THE INVENTION

1. Technical Field

This invention relates, in general, to the design and production of semiconductor microchips. More particularly, this invention relates to methods for electrically connecting the various components of a semiconductor microchip.

2. Background Art

The advent of the microchip has revolutionized life in the latter half of the 20th century. Microchips are a ubiquitous part of life, being found in everything from computers to garage door openers. Over the years, the microelectronics industry has diligently sought to further reduce the size of the microelectronics built on silicon chips.

Figure 23:
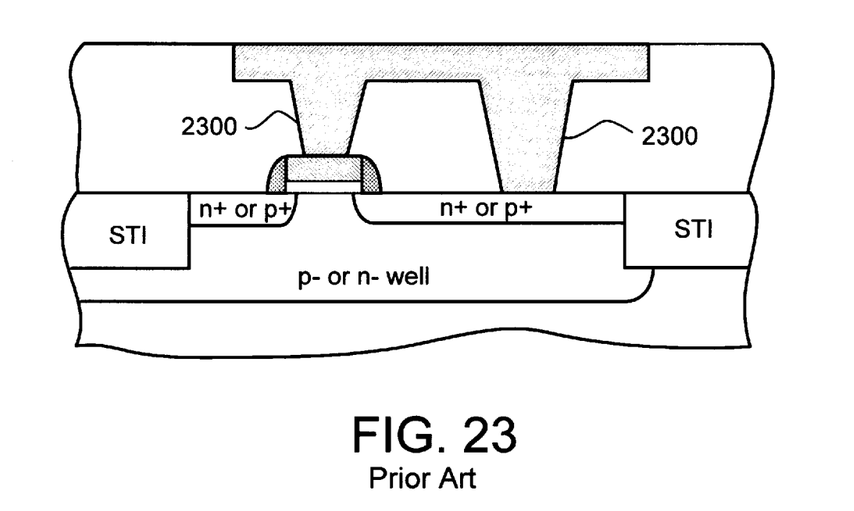
FIG. 23 is a cross sectional view of a prior art separate contact.

One of the major factors in determining the degree of miniaturization possible on a chip is the amount and type of connections required between the electrical devices contained on the chip. One approach has been to provide a "separate contact" where devices on a chip are electrically connected by the deposition and etching of metals or other conductors between the devices to be connected. One example of this approach is the "damascene" process. According to the damascene process, "troughs" are etched in the silicon dioxide between circuit devices. The entire surface of the chip is then covered with copper or aluminum. Next, the copper is planarized, removing it from the chip's surface and leaving copper only in the troughs. The remaining lines of copper are referred to as "wires" and electrically connect some or all of the devices on a layer of a chip. An example of this is shown in FIG. 23, where two contact vias 2300 are formed that connect the gate to the source/drain diffusion through the interconnect wiring.

Figure 24:
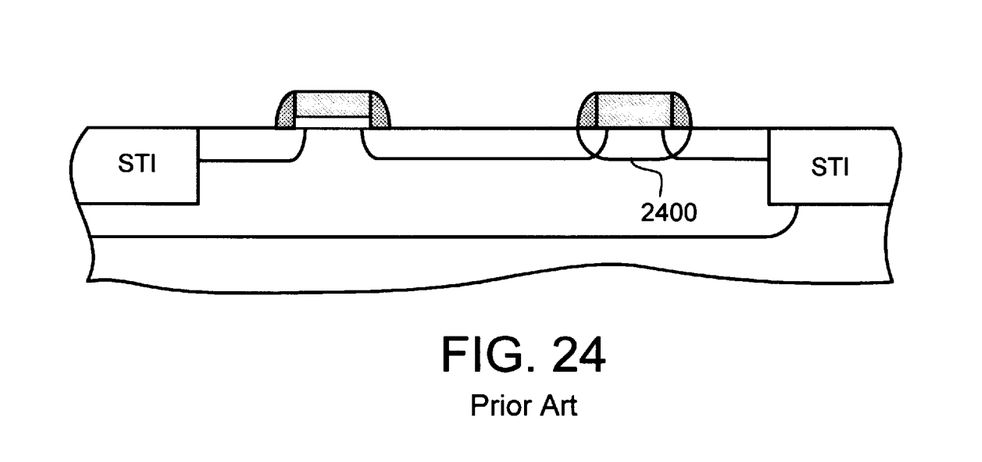
FIG. 24 is a cross sectional view of a prior art buried contact.

The other approach to electrically connecting devices on a chip is to use a "buried contact". A buried contact uses selective doping and diffusion of impurities in the silicon of a chip to provide an electrical connection between the devices on a chip through doped silicon. A buried contract is typically used to electrically connect a device to a nearby region of doped silicon. An example of this is shown in FIG. 24, where the diffusion region 2400 forms a buried contact between a gate conductor and the source/drain diffusion. This of course requires the selective removal of the gate oxide which can lead to processing difficulties.

Both separate contacts and buried contacts present problems to chip design and manufacturing. Using separate contacts made from metals or other conductors to connect devices on a chip requires the additional steps of deposition and etching to establish the proper pattern of connections. Using separate contacts also increases the size of the chip, as there must be enough room on the chip to contain the conducting traces and the connections. By using a traditional buried contact to electrically connect the various devices on a microchip a higher density chip can be manufactured. However, the buried contacts sometimes fail to produce predictable low resistive contacts. Also, a traditional buried contact often encounters current leakage from the buried contact to the chip substrate.

Accordingly, the need exists for a new type of low resistive contact that allows for more compact chip design while avoiding excessive current leakage that is built by relatively simple processing.

DISCLOSURE OF INVENTION

The present invention overcomes the difficulties found in the background art by providing a direct low resistive contact between devices on a semiconductor chip without excessive current leakage. Current leakage is prevented in the preferred design by using silicon on insulator (SOI) construction for the chip. By constructing the direct contact over an insulator, such as silicon dioxide, current leakage is minimized. The preferred embodiment uses silicide to connect a polysilicon gate to a doped region of the substrate. An alternative embodiment of the present invention provides for the use of conductive studs to electrically connect devices. An increased density of approximately twenty percent may be realized using the present invention.

BEST MODE FOR CARRYING OUT THE INVENTION

The preferred embodiment of the present invention provides a new type of contact which can be used to connect between semiconductor devices and other elements on a wafer. The new contact has the advantage of being compatible with existing commonly used fabrication techniques while achieving greater device density. According to the first embodiment of the invention, silicide is used to connect gate stacks to adjacent doped portions of the wafer. This can be used to connect the gates of one transistor to the sources and drains of other transistors, as well as to other structures on the wafer. According to a second embodiment of the invention, an interconnect stud is used to form the connection between the gate stack and the adjacent doped portions of the wafer.

Figure 1:
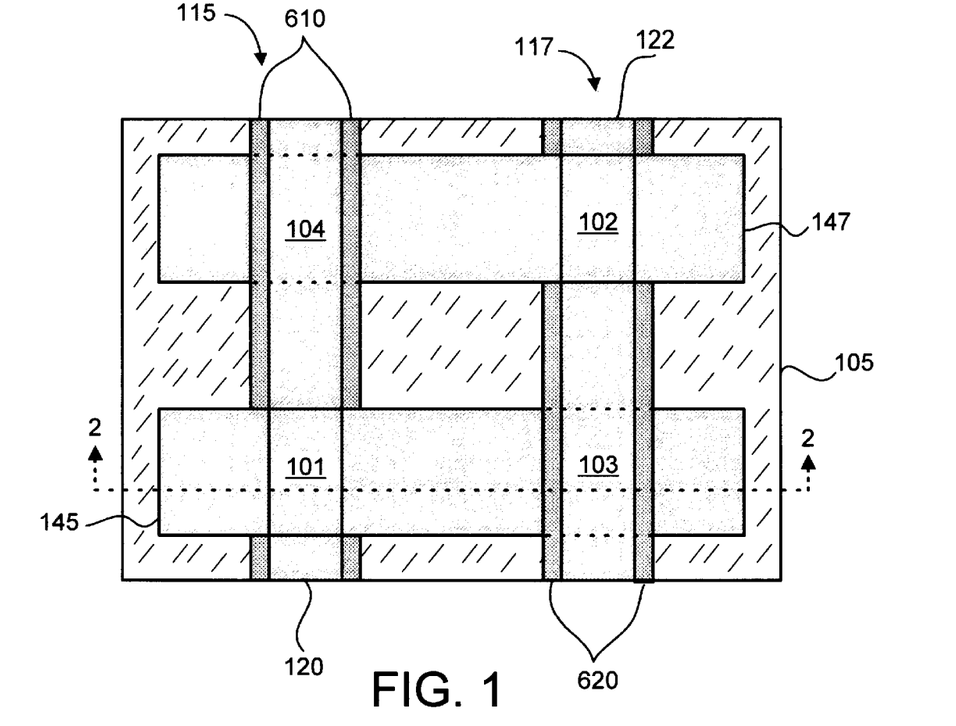
FIG. 1 is a top view of a contact in accordance with the preferred embodiment.
Figure 2:
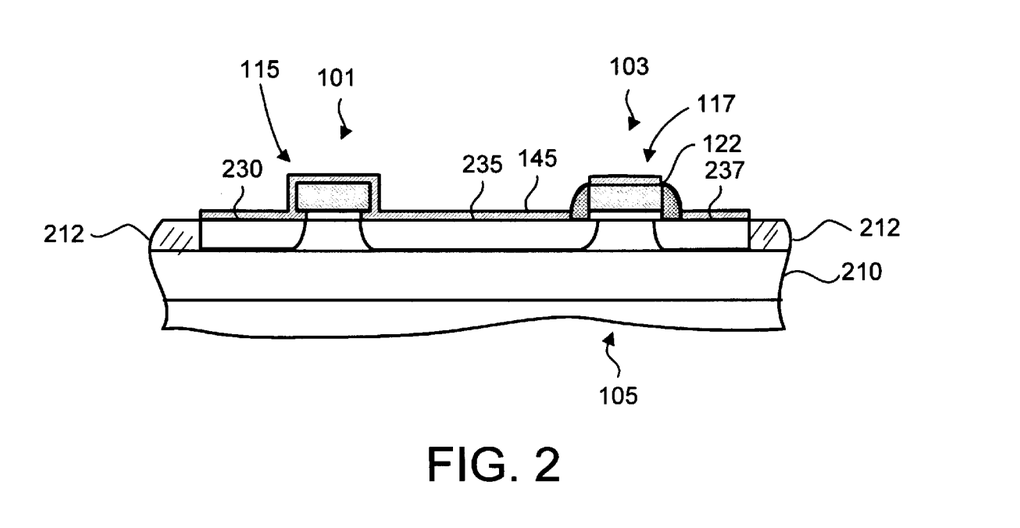
FIG. 2 is a cross-sectional view of a contact in accordance with the preferred embodiment.

Referring now to FIGS. 1 and 2, an exemplary substrate 105 is shown in which two contacts 101 and 102 have been formed in accordance with a first preferred embodiment. Also formed on substrate 105 are two transistors 103 and 104. FIG. 1 shows a top view of the substrate 105, while FIG. 2 shows a cross section of the substrate taken along line 2—2 of FIG. 1.

As shown FIGS. 1 and 2, the contacts 101 and 102 provide a new way of electrically connecting devices on a chip that is termed a "direct contact". A direct contact formed in accordance with the present invention provides a more space efficient connection than may sometimes be attainable using a traditional separate contact, while avoiding the current leakage and processing complexity problems posed by traditional buried contacts. In FIG. 1, contact 101 uses a layer of silicide 145 to connect the gate stack 115 to diffusions 230 and 235. This provides a connection between the gate of transistor 104 to the source/drain of transistor 103. Likewise, contact 102 uses silicide 147 to connects the gate stack 117 to diffusions 835 and 837 (not shown in these FIGS.). This provides a connection between the gate of transistor 103 to the source/drain of transistor 104. Silicide also remains on the top of the gate stacks 115 and 117, improving the conductivity of the gate stacks. Of course, these are just examples of the many types of connections that can be formed using the preferred embodiments. The substrate 105 preferably includes a buried insulator layer 210. These types of substrates formed in silicon are typically referred to as silicon-on-insulator (SOI) wafers, and can be formed using many known techniques. For example, one acceptable technique for creating a silicon on insulator substrate is described in U.S. Pat. No. 4,676,841, entitled "Fabrication of dielectrically isolated devices utilizing buried oxygen implant and subsequent heat treatment at temperatures above 1300° C.". In this case, the insulator 210 used is preferably silicon dioxide, but one skilled in the art will realize that other insulators are available for this use.

Figure 3:
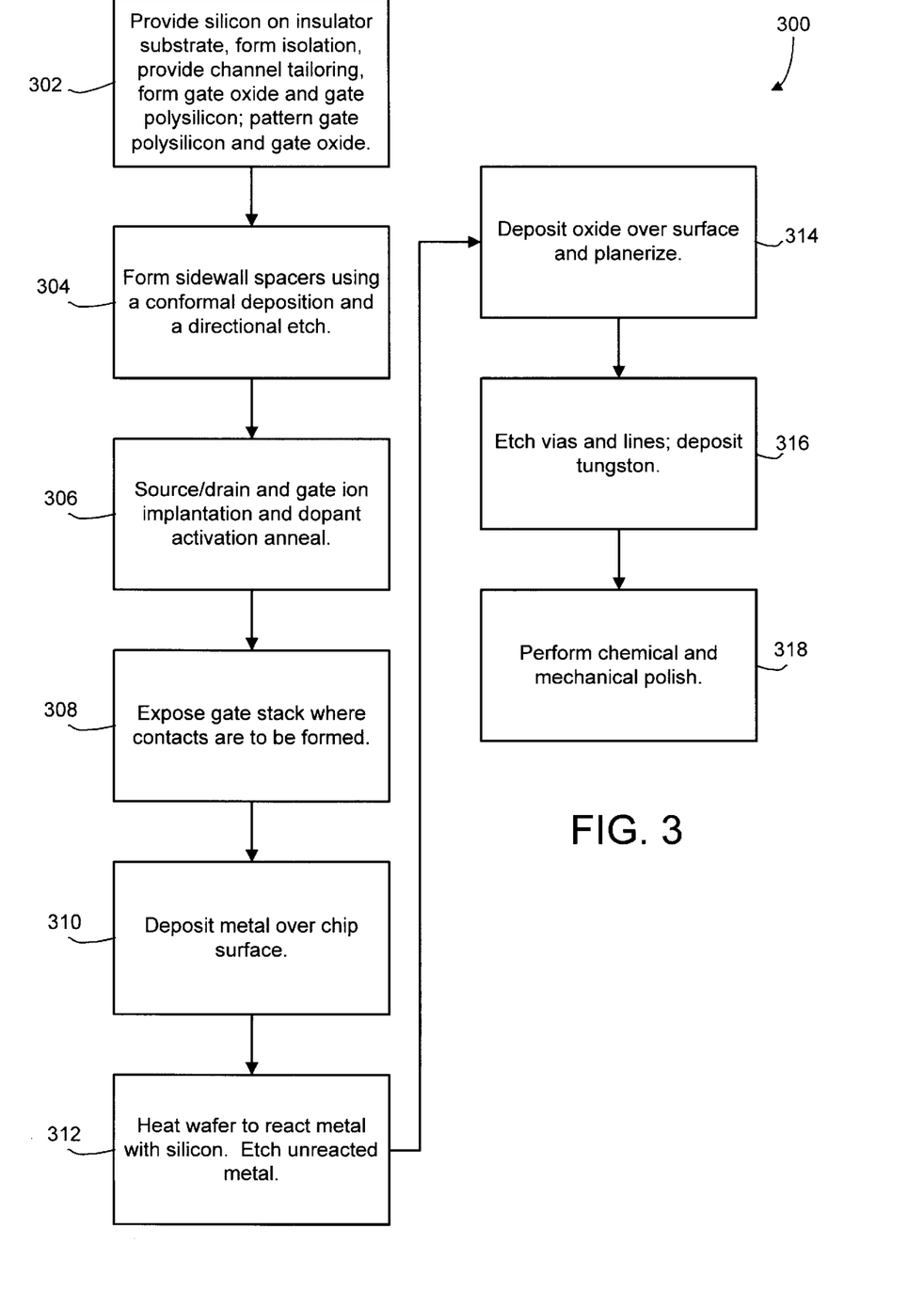
FIG. 3 is a method in accordance with the preferred embodiment.

Referring now to FIG. 3, a method 300 for creating a contact in accordance with the preferred embodiment is shown. The first step 302 in method 300 is perform the initial preparation of a suitable substrate on which to form devices and the preferred embodiment contacts. This preferably includes providing a suitable silicon on insulator (SOI) substrate, forming isolation regions, and forming and patterning the gates. The silicon on insulator substrate is preferably composed of lightly p-doped silicon.

Those skilled will realize that there are numerous ways to provide a silicon on insulator substrate. According to the preferred embodiment of the present invention the "buried oxide" method is used. To prepare a buried oxide substrate, $O^+$ is implanted into a silicon substrate at elevated temperatures (typically between 500° C. and 700° C.). The $O^+$ is implanted at a dose and energy sufficient to locate the peak of the implant at a desired distance beneath the surface of the silicon substrate. Those skilled in the art are knowledgeable as to how to adjust both $O^+$ dosage and energy based upon the requirements of a particular application. After the $O^+$ has been implanted, the substrate is annealed in an oxidizing ambient at a sufficient temperature (typically greater than 1300° C.) and for a sufficient time to return the top silicon to its crystalline form and to form a buried layer of silicon dioxide. Of course, this is just one example of the many ways that can be used to form a SOI wafer, and that other methods and other dielectrics are equally applicable. For example, methods such as epitaxial silicon on sapphire or silicon direct wafer bonding, may be used.

With an appropriate SOI wafer, further processing proceeds as follows. The next part of this step is to form isolation regions. In the preferred embodiment, the isolation regions comprises shallow trench isolation (STI). The STI is preferably formed over the wafer in all areas except where the devices are formed, which are generally called the "active areas". Thus, the formation of the STI also defines the active areas on the wafer. STI is suitably formed by etching isolation trenches to the top of the buried oxide, filling the isolation trenches by depositing a suitable dielectric (such as CVD oxide) and planerizing by chemical mechanical polish.

With the STI formed, well and gate tailor implants are made where devices are to be formed. These are done to provide the appropriate channel doping and to adjust the threshold voltage of the FET device to be built. This step is generally performed at least twice, once for n-channel devices and again for p-channel devices using appropriate photoresist as implant blocking masks.

The next part of this step is to form the material for the gate stack on the wafer. The first layer of the gate stack is a gate dielectric of preferably 10 nm or less, such as silicon dioxide which can be grown on the silicon. This is typically referred to as gate oxide. The next layer of the gate is preferably a conductor such as polysilicon, which is deposited over the gate oxide. To form conductive polysilicon, intrinsic polysilicon is deposited and later, typically during source/drain implanting, doped either n+ or p+ type to make it conductive.

The next part of this step is to pattern the gate stack to define the various gates on the devices. Preferably this is done using any of the many etching process known in the art to pattern polysilicon and gate oxide.

Figure 4:
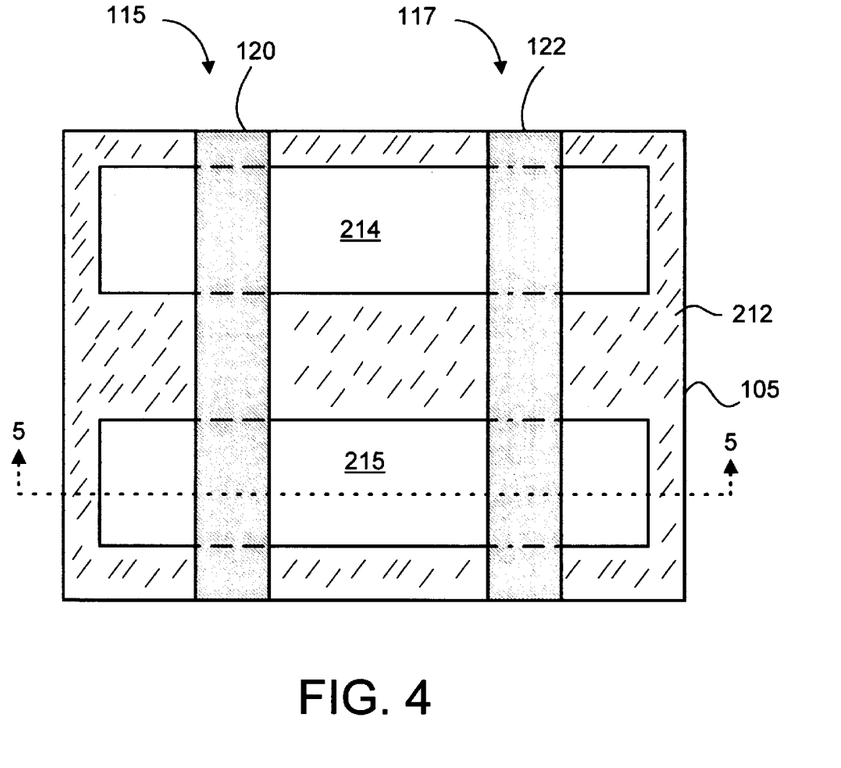
FIG. 4 is a top view of the first step of the method according to the preferred embodiment.
Figure 5:
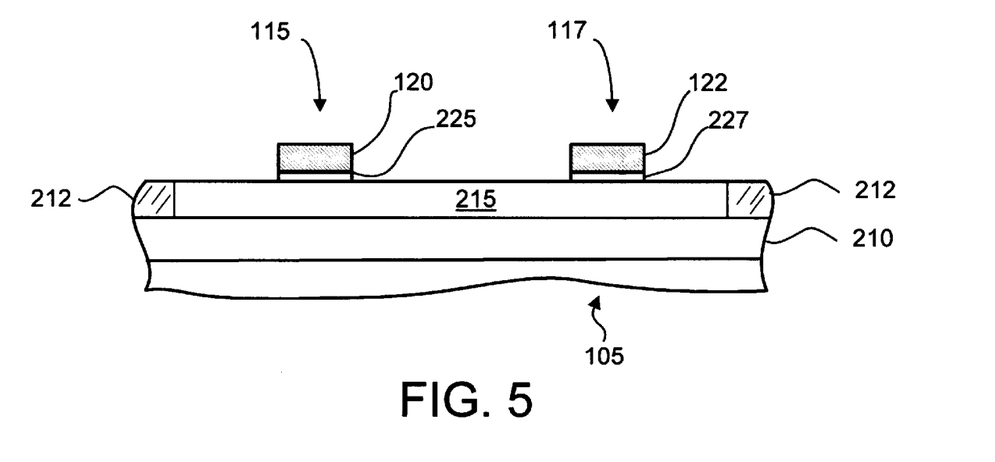
FIG. 5 is cross-sectional view of the first step of the method according to the preferred embodiment.

Turning now to FIGS. 4, and 5, an exemplary silicon substrate 105 is shown after processing according to step 302 of method 300, with FIG. 5 being a cross section taken along line 5—5 in FIG. 4. In FIGS. 4 and 5, the silicon substrate 105 includes a buried oxide region 210, which together comprises an SOI substrate on which devices and contacts in accordance with the preferred embodiment can be formed. Shallow trench isolation 212 has been formed over the silicon substrate, defining two active areas 214 and 215 in which devices can be formed.

On top of the silicon substrate 105 gate stack layers have been formed and patterned to form two gates 115 and 117. Gate 115 includes a gate dielectric 225 and a polysilicon 120. Likewise, gate 117 includes a gate dielectric 227 and a polysilicon 122.

Figure 6:
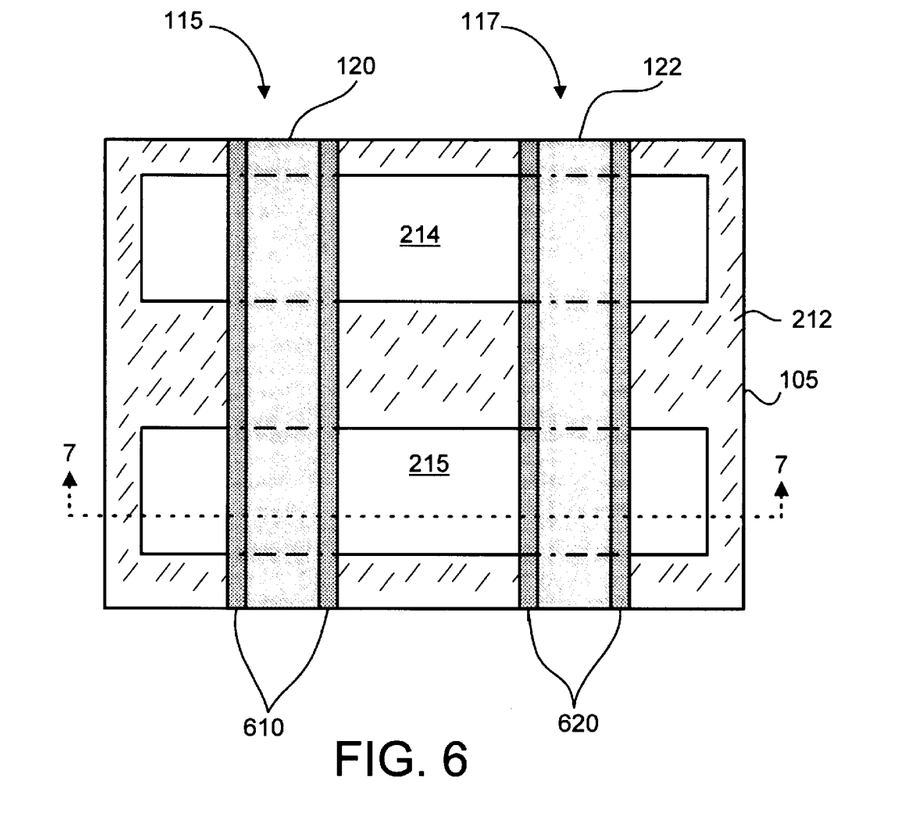
FIG. 6 is a top view of the second step of the method according to the preferred embodiment.
Figure 7:
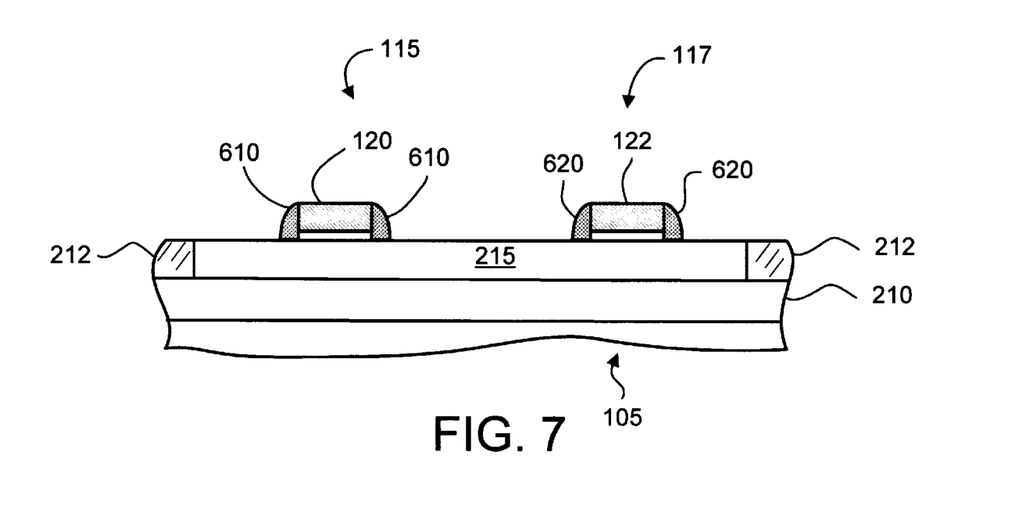
FIG. 7 is a cross-sectional view of the second step of the method according to the preferred embodiment.

Referring again to FIG. 3, the next step 304 in method 300 is to create sidewall spacers on the sidewalls of the gate stacks. These can be formed by any method, such as a conformal deposition of dielectric material followed by a directional etch. Turning now to FIGS. 5 and 6, the silicon substrate 105 is illustrated after sidewall spacers have been formed. Sidewall spacers 610 have been formed on the sidewalls of gate 115, and sidewall spacers 620 have also been formed on the sidewalls of gate 117.

Figure 8:
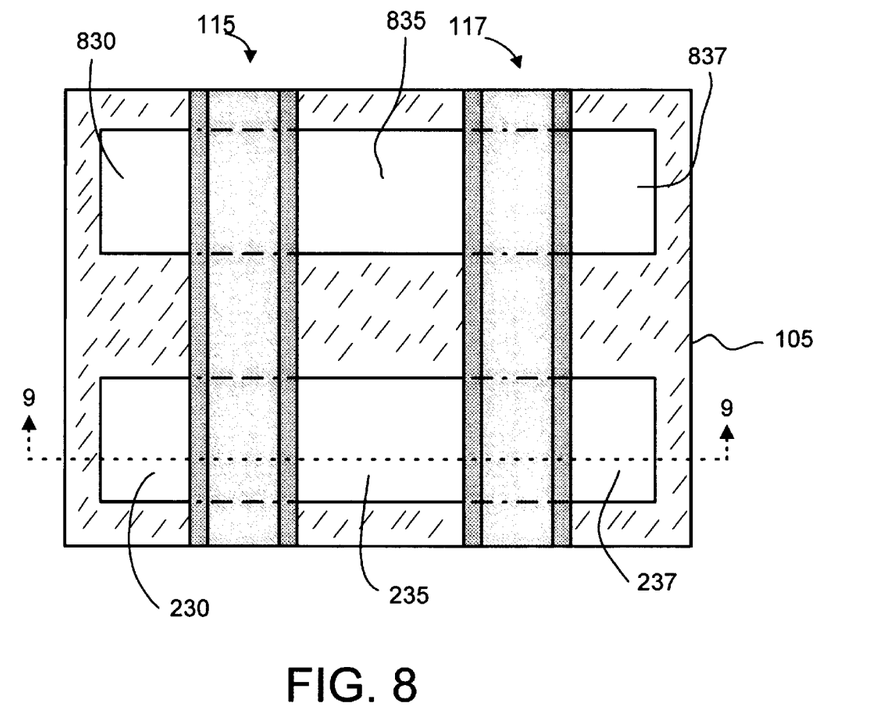
FIG. 8 is a top view of the third step of the method according to the preferred embodiment.
Figure 9:
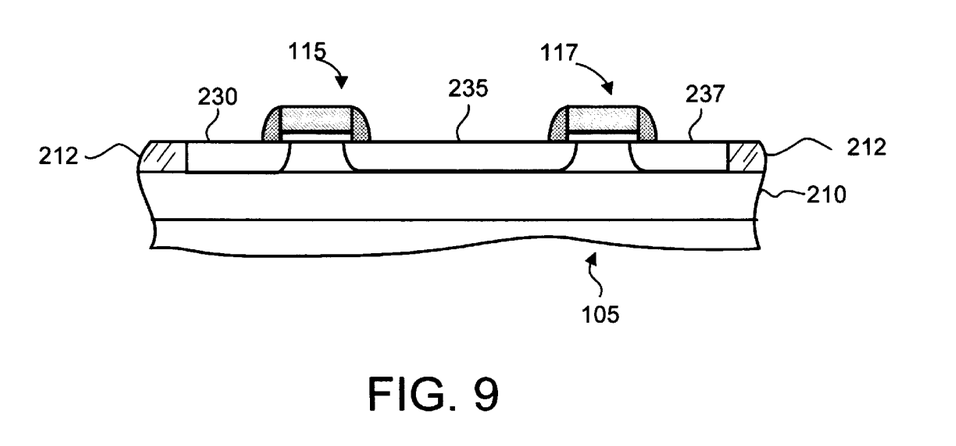
FIG. 9 is a cross-sectional view of the third step of the method according to the preferred embodiment.

Referring again to FIG. 3, the next step 306 in method 300 is to create the source and drain diffusions of the devices. This process is well know in the art and consists of using the gate stack and sidewall spacers as masks while bombarding the silicon substrate with the appropriate dopants. The substrate is then heated to activate the implanted dopants. This results in the creation of source and drain diffusion regions on either side of the gates in the active areas. The remaining lightly doped substrate beneath the gate oxide serves as a channel region. This process also dopes the gate polysilicon to make it a conductor. This step is performed at least twice, once for n-channel devices and again for p-channel devices using appropriately patterned photoresist as implant blocking masks. The result of step 306 of method 300 is shown in FIGS. 8 and 9. There are now diffusion regions 230, 235, 237, 830, 835, and 837 formed in the active areas 214 and 215. These diffusion regions serve as the sources and drains for the devices on the substrate 105.

Again referring to FIG. 3, the next step 308 of the method 300 is to expose the gate conductors where contacts are to be made to adjacent diffusion regions, while not exposing portions of the gate conductor where devices are to be formed. This suitable involves removing the sidewall spacers and any other dielectric covering the gate stack from those portions of the gate stack where contacts are going to be formed. This is preferably done by depositing photoresist and patterning it to expose only the portions of the gate stack and their sidewall spacers where contacts are to be formed, and then etching away the exposed the sidewall spacers and any other covering dielectric. This process typically removes a portion of the gate oxide at the bottom of the gate stack as well.

Figure 10:
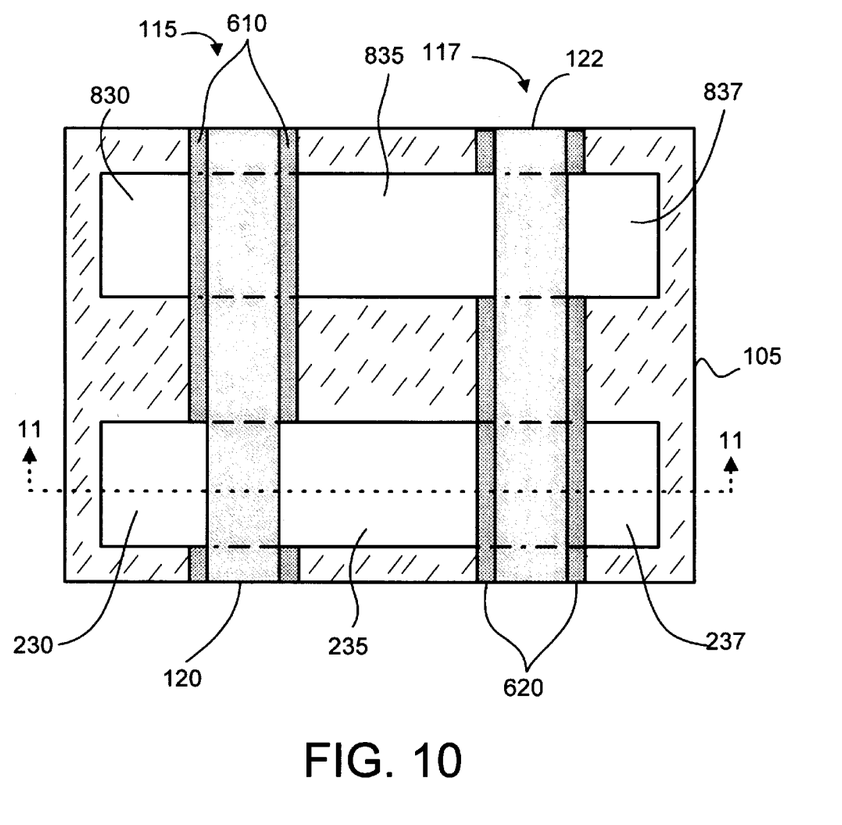
FIG. 10 is a top view of the fourth step of the method according to the preferred embodiment.
Figure 11:
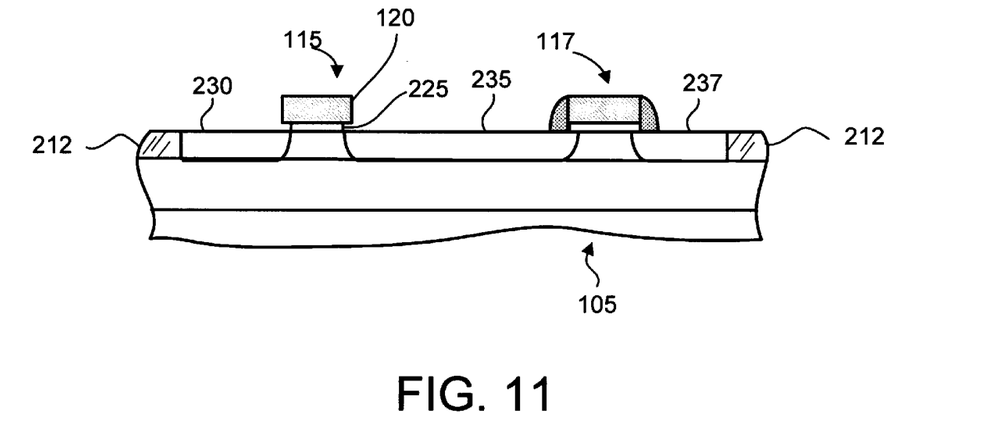
FIG. 11 is a cross-sectional view of the fourth step of the method according to the preferred embodiment.

Turning now to FIGS. 10 and 11, the semiconductor substrate 105 and the devices thereon are illustrated after the gate stacks have been selectively exposed where contacts in accordance with the preferred embodiment are to be formed. In particular, parts of sidewall spacers 610 have been removed from the sidewalls of the polysilicon 120. This will allow contacts in accordance with the preferred embodiment to be formed between polysilicon 120 and diffusion 230 and 235. Likewise, parts of the sidewall spacers 620 have been removed from the sidewalls of polysilicon 122. This will allow contacts in accordance with the preferred embodiment to be formed between polysilicon 122 and diffusions 835 and 837. The sidewall spacers remain around the other portions of the gate stacks 115 and 116. This will allow a first transistor to be formed with gate stack 117 and diffusions 235 and 237 and a second transistor to be formed with gate stack 115 and diffusions 830 and 835.

Figure 12:
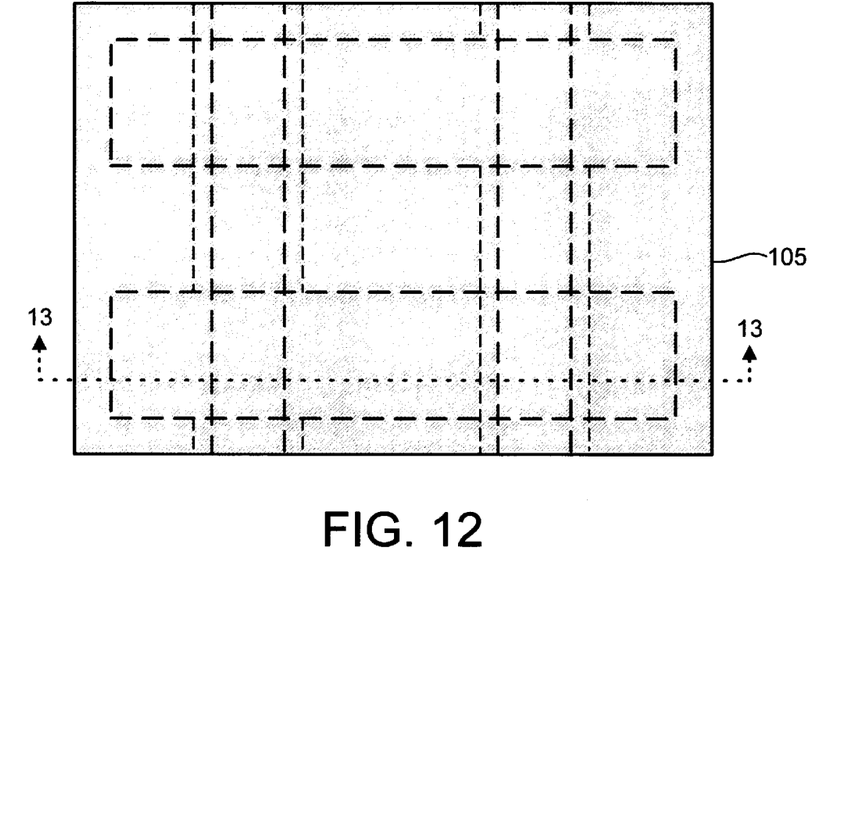
FIG. 12 is a top view of the fifth step of the method according to the preferred embodiment.
Figure 13:
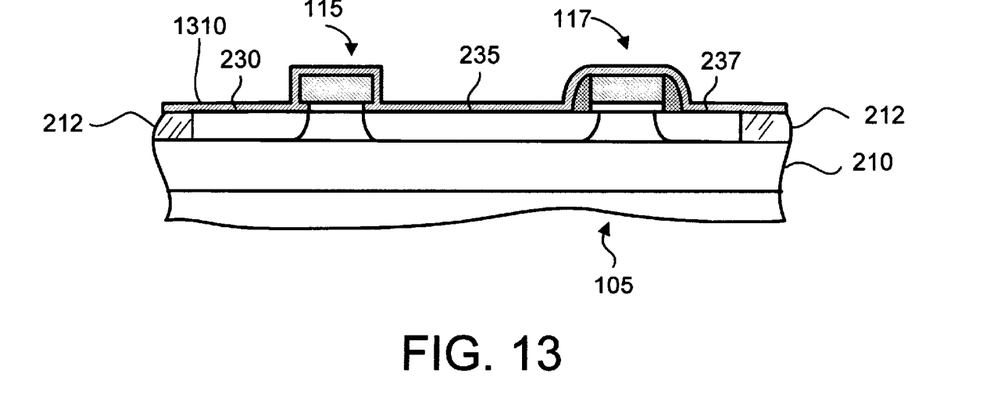
FIG. 13 is a cross-sectional view of the fifth step of the method according to the preferred embodiment.

Returning to FIG. 3, the next step 310 of the method 300 is to deposit a metal to be used in selectively forming the silicide over the surface of the polysilicon and silicon substrate. While there are numerous possible choices of metals, the preferred embodiment uses titanium or cobalt. The result of this step is shown in FIGS. 12 and 13. A layer of titanium 1310 covers the silicon substrate 105.

The next step 312 is to heat the metal to cause it to react with the exposed silicon, and etch the unreacted metal. The wafer is preferably heated to approximately 700–900° Celsius, causing the titanium to react with silicon that it has contacted to form titanium silicide. Thus, a layer of titanium silicide forms where there was exposed silicon, while the titanium over other regions (such as silicon dioxide) remains unreacted. The unreacted metal is then removed using a wet etch process selective to the reacted metal.

The results of this step are illustrated in FIGS. 1 and 2. Titanium silicide has been formed wherever there was exposed silicon. The remaining portions of the titanium have been removed. Thus, titanium silicide is formed over the active areas and the exposed portions of the polysilicon gate material, while the titanium has been removed from the isolation regions and the remaining sidewall spacer materials. Titanium silicide grows both from the gate polysilicon and from the silicon substrate surface and bridges over gate oxide to connect the gate polysilicon and the silicon substrate. In particular, titanium silicide 145 is formed that connects the gate polysilicon 120 to diffusions 230 an 235. This provides a connection between the gate of transistor 104 to the source/drain of transistor 103. Likewise, titanium silicide 147 is formed that connects the gate polysilicon 122 to diffusions 835 and 837. This provides a connection between the gate of transistor 103 to the source/drain of transistor 104. Titanium silicide also is formed on the top of the gate stacks 115 and 117, improving the conductivity of the gate stacks. Again, the sidewall spacers 610 and 620 remain around the other portions of the gate stacks 115 and 117, preventing titanium silicide from forming there. This will allow transistor 103 to be formed with gate stack 117 and diffusions 235 and 237 and transistor 104 to be formed with gate stack 115 and diffusions 830 and 835.

Again, it should be noted that if this approach is used on a typical wafer instead of a SOI wafer, such a connection would likely experience the problem of current leaking to the substrate. According to the preferred embodiment, though, current leakage is not a problem because a buried insulator 210 is formed in the substrate 105 and the diffusions which are butted against the buried insulator 211 and STI 212 prevent leakage current from flowing to any other area of the chip.

Returning now to FIG. 3, for the remaining steps of the method 300, fabrication of the chip is completed according to conventional chip processing procedures. Typically, silicon dioxide is deposited over surface of this layer of the chip, followed by planerization by chemical mechanical polish in step 314. Next, in step 316, vias and lines are etched in the silicon dioxide according to processes well known in the art and tungsten is deposited over the chip's surface. The chip is then completed with mechanical and chemical polishing in step 318.

Thus, the first embodiment of the present invention provides a method and structure for making a direct contact between a polysilicon conductor and the silicon substrate.

Turning now to FIGS. 14–20, a second embodiment of the present invention is illustrated. In the second embodiment a vertical interconnect is used to connect the gate stack to adjacent diffusion regions instead of the formed silicide used in the first embodiment. Vertical interconnects, commonly referred to as "studs" are wiring structures used to connect devices to interconnect wiring formed above the devices. Studs are often formed using techniques such as damascene, but can also be formed using any other suitable technique. Studs can comprise any conductive material such as tungsten, tungsten silicide, doped polysilicon, copper or aluminum, but preferably comprise tungsten. Thus, in this application, the term "stud" is meant to include any vertical interconnect structure formed to connect devices with interconnect wiring.

Figure 14:
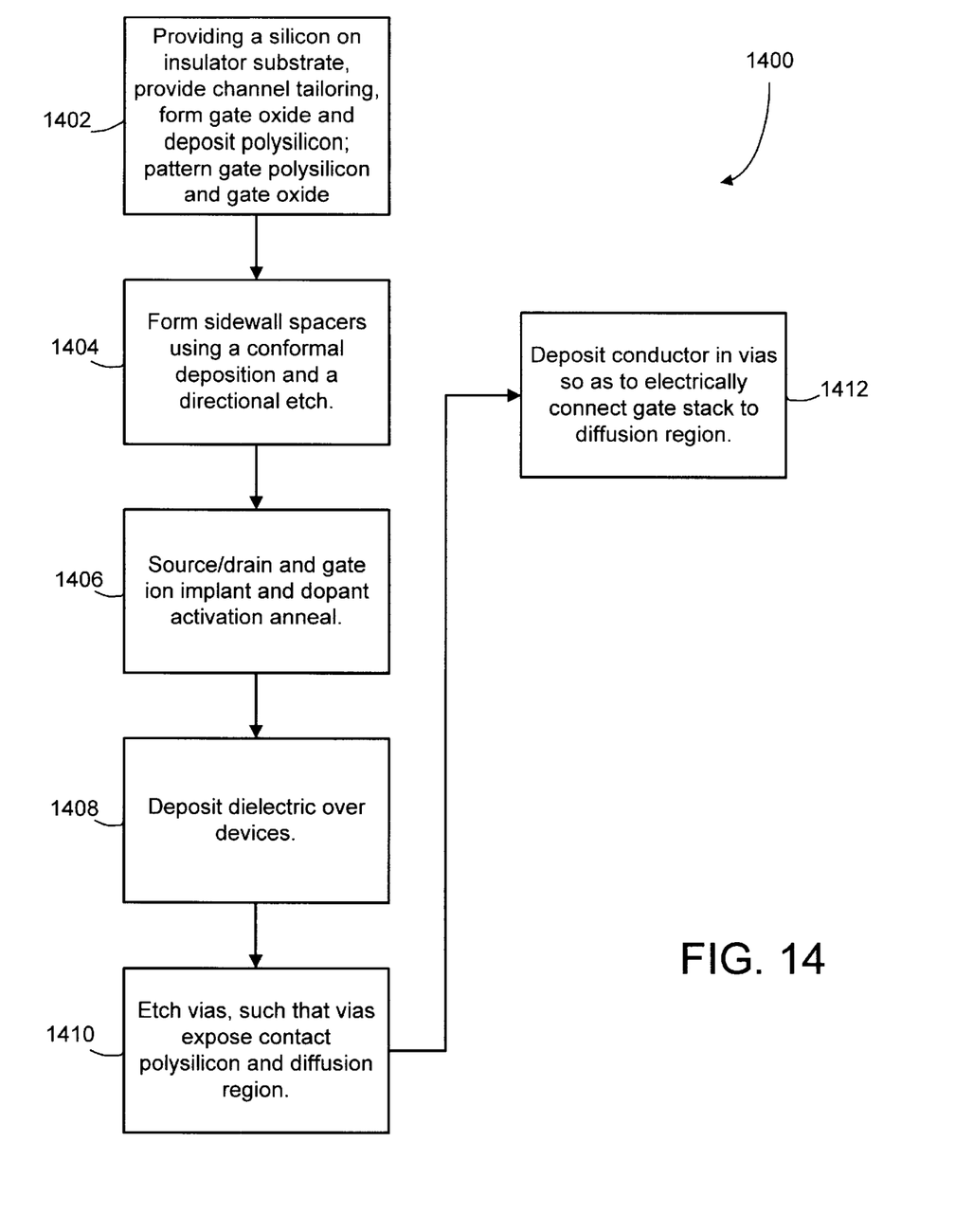
FIG. 14 is a method in accordance with a second exemplary embodiment.

The second embodiment of the present invention uses the stud to form the electrical connection between the gate stack and the adjacent diffusion region. A method 1400 in accordance with the second embodiment of the invention is shown in FIG. 14. The second embodiment uses the same initial steps as the first embodiment of providing a silicon on insulator substrate, forming isolation regions, providing channel tailoring, growing gate oxide, depositing gate polysilicon, and patterning the gate polysilicon and the gate oxide to form gates in step 1402. The sidewall spacers are created in step 1404, and source/drain diffusions are created and the gate polysilicon is doped in step 1406 as with the first embodiment. These completes formation of the devices.

With the devices formed, the studs and interconnect wiring are formed. In the second embodiment of the present invention, these process is modified to facilitate formation of the direct contact.

In the illustrated embodiment, the studs and interconnect wiring are formed using a damascene process. Damascene is a well know process that involves forming a dielectric layer, etching vias in the dielectric layer for the studs. The vias are then filled with a conductive material such as tungsten. The excess material is then removed using a planerization process such as chemical mechanical polish (CMP).

Thus, the next step 1408 in the second embodiment is to deposit a dielectric layer. This is the layer in which the studs and interconnect wiring will be formed. In the preferred embodiment, the dielectric layer comprises silicon dioxide, but it could also comprise other suitable dielectrics. After the dielectric is deposited it will typically be polished to ensure a flat surface.

Figure 15:
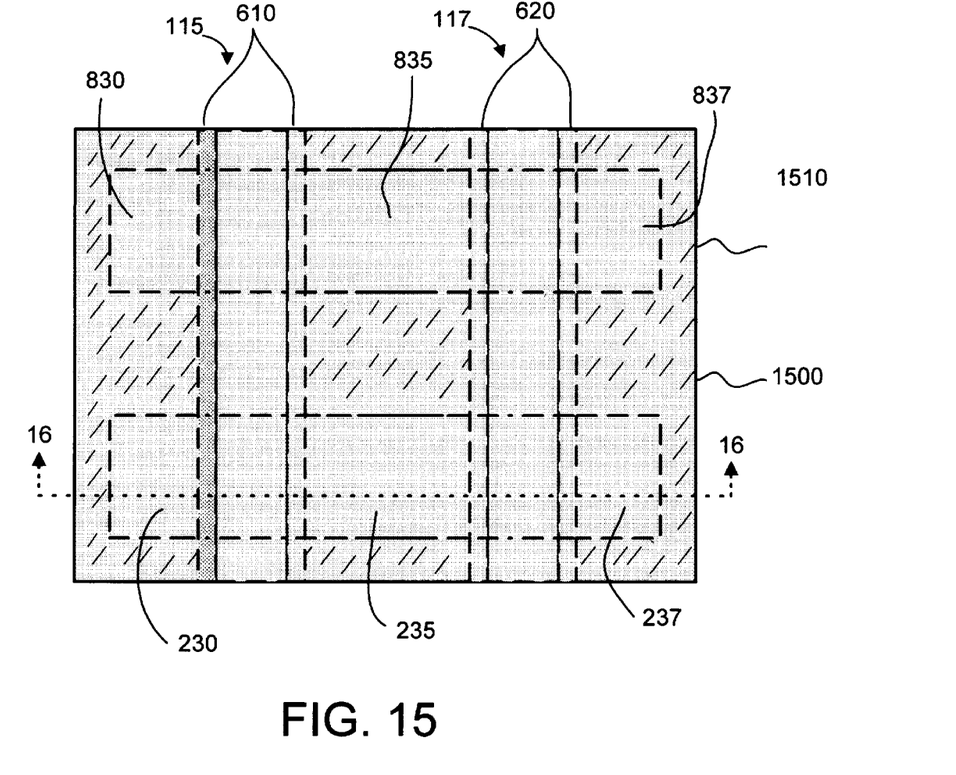
FIG. 15 is a top view of a step in accordance with the second exemplary embodiment.
Figure 16:
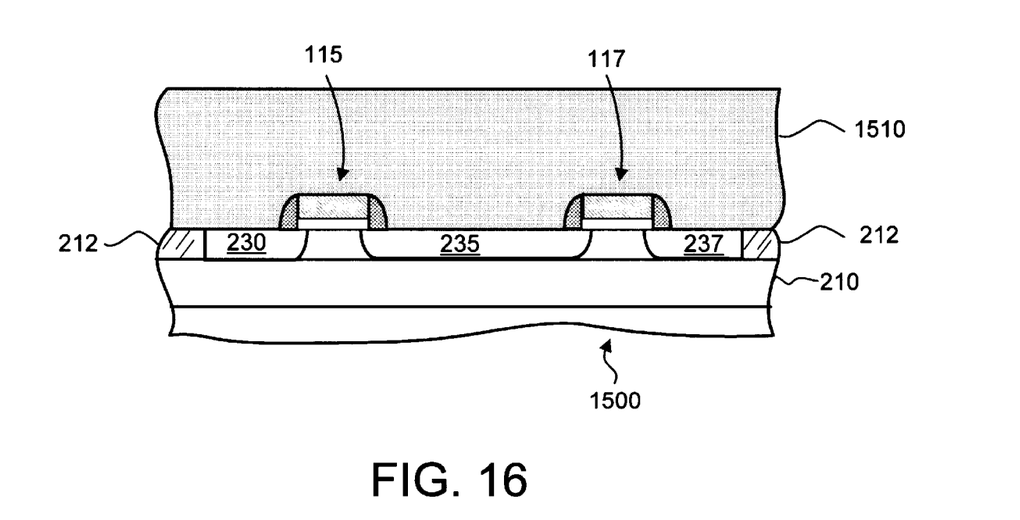
FIG. 16 is a cross-sectional view of a step in accordance with the second exemplary embodiment.

Turning now to FIGS. 15 and 16, an exemplary wafer portion 1500 is illustrated, where FIG. 16 is a cross sectional view taken along line 16—16 in FIG. 15. Wafer portion 1500 is illustrated after devices have been formed and a silicon dioxide layer 1510 deposited over the top of the devices in accordance with the preferred embodiment.

Figure 17:
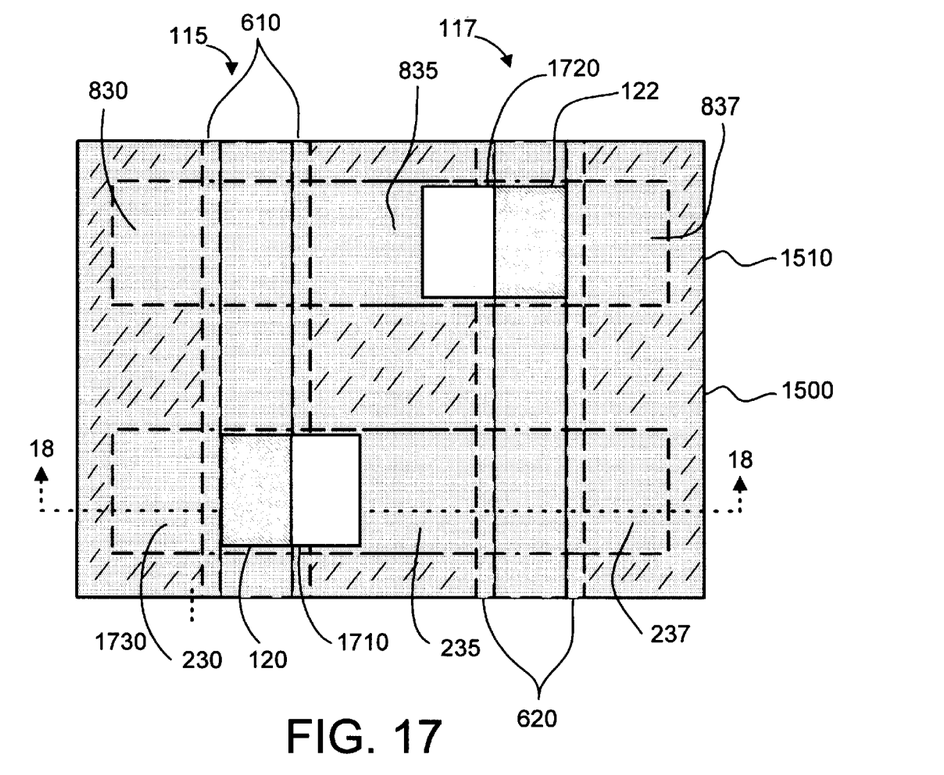
FIG. 17 is a top view of a step with the second exemplary embodiment.
Figure 18:
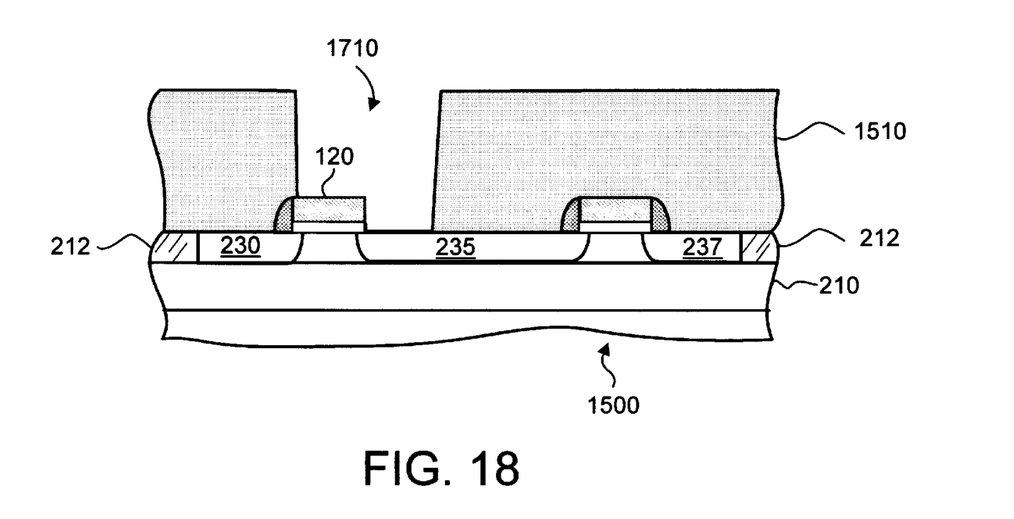
FIG. 18 is a cross-sectional view of a step with the second exemplary embodiment.

The next step 1410 in method 1400 is to etch vias in the deposited dielectric, with the vias being etched such that the contact regions of the gate stack and diffusion regions are exposed. This processes also preferably removes the sidewall spacers that exist between the gate stack and the diffusion that is to be connected to the gate stack. Turning now to FIGS. 17 and 18, the exemplary wafer portion 1500 is illustrated after vias have been etched, exposing the portions of the gate stacks and diffusion regions where contacts are to be formed. Portions of the silicon dioxide 1510 have been removed to create vias 1710, 1720. At least one portion sidewall spacer 610 from gate stack 115 and at least one portion of sidewall spacer 620 from gate stack 117 was removed. The etching of via 1710 exposed the contact polysilicon 120 of the gate stack 115 and diffusion region 235. The etching of via 1710 exposed the contact polysilicon 122 of the gate stack 117 and diffusion region 835.

It should be noted that if the vias are etched as part of a damascene method of forming interconnect wiring, that wiring troughs would also be etched at this time, although they are not shown in the FIGS.

Returning to FIG. 14, the next step 1412 of method 1400 is to deposit a conductor to form the stud in the vias. Any suitable conductor can be used, such as tungsten, tungsten silicide, doped polysilicon, aluminum or copper. In the preferred embodiment, the stud serves to connect gate conductor to an adjacent diffusion region. After the stud material has been deposited, the excess material is removed using any suitable process, such as a chemical mechanical polish.

Figure 19:
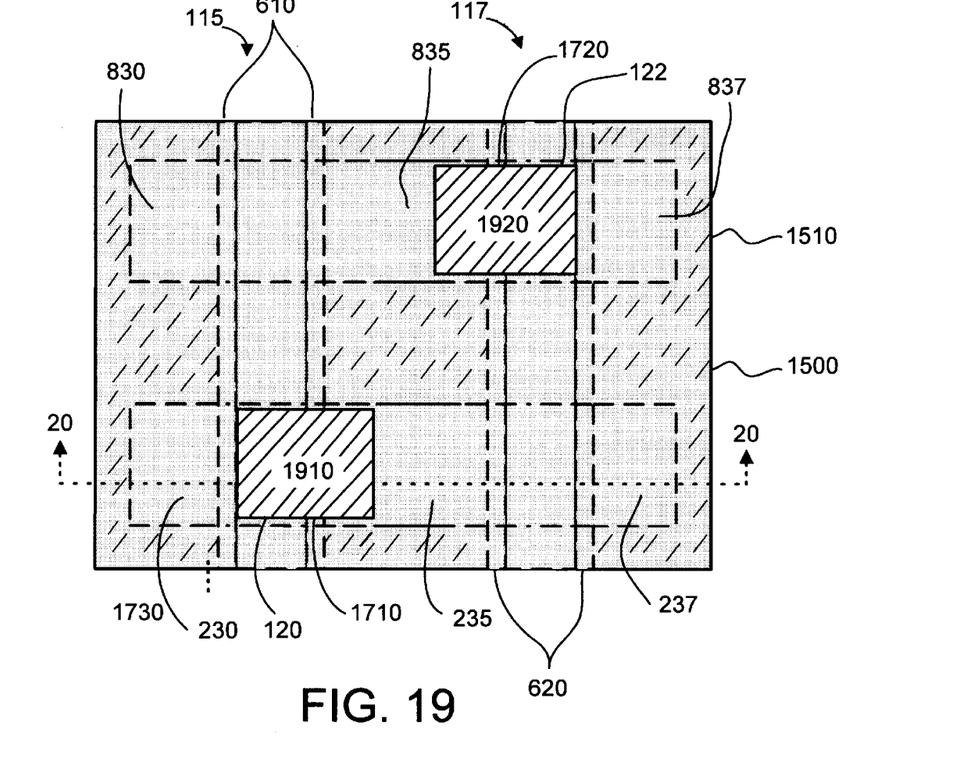
FIG. 19 is a top view of a step with the second exemplary embodiment.
Figure 20:
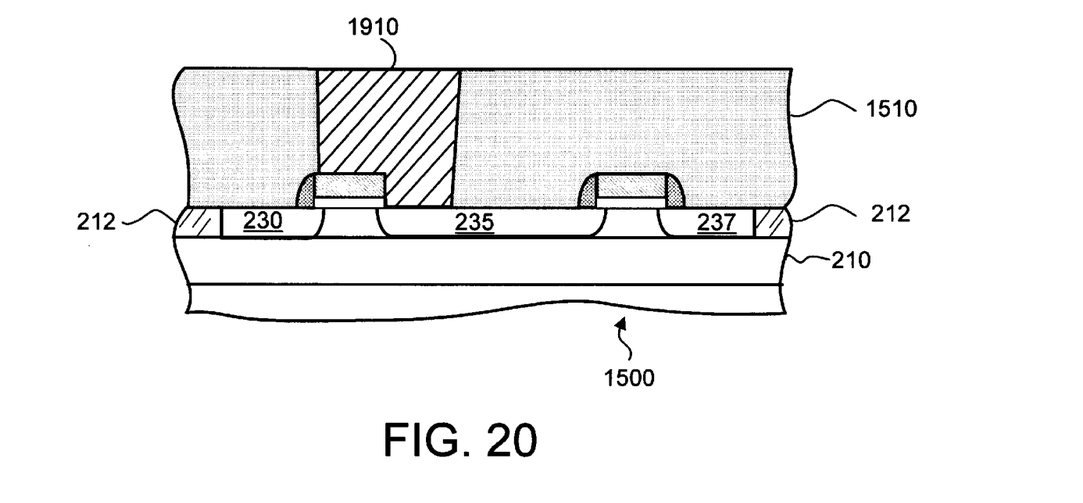
FIG. 20 is a cross-sectional view of a step with the second exemplary embodiment.

Turning to FIGS. 19 and 20, the wafer portion 1500 is illustrated after the stud material has been deposited and planarized. In the illustrated embodiment, tungsten has been deposited into the vias 1710, 1720 to form tungsten studs 1910, 1920. The tungsten stud 1910 contacts the polysilicon 120 and diffusion region 235 to electrically connect the gate stack 115 to diffusion region 235. The second tungsten stud 1920 contacts the polysilicon 122 of the gate stack 117 and diffusion region 835 to electrically connect the gate stack 117 to diffusion region 835.

Thus, the second embodiment can be used to provide a connection between the gates and diffusion regions of select devices in a similar manner as the first embodiment. In particular, the studs provide a connection between the gate of one transistor to the source/drain of another transistor.

It should be noted that while the sidewall spacers are illustrated as being partially removed during the via etch, they could also be removed during a separate etch step as in the first embodiment.

Figure 21:
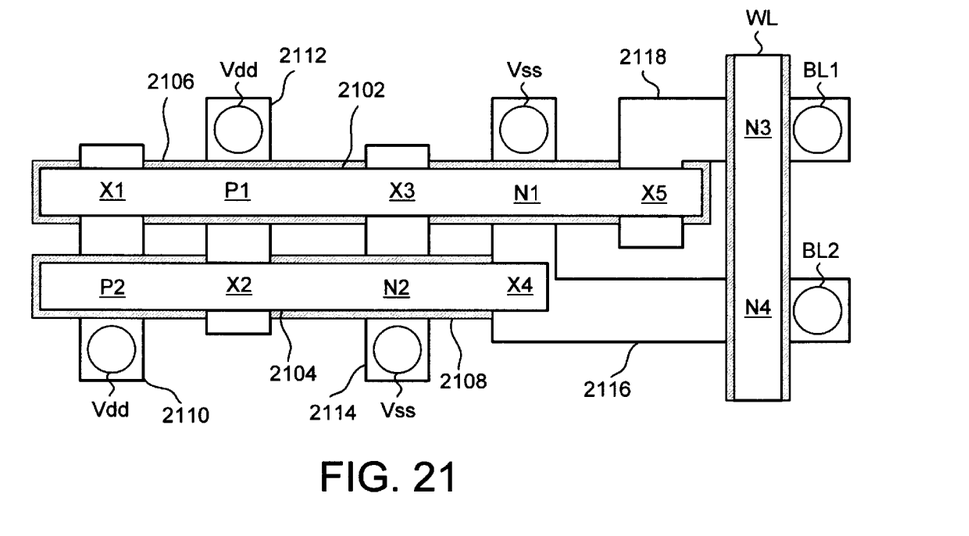
FIG. 21 is a schematic diagram of an SRAM formed using the preferred contacts.
Figure 22:
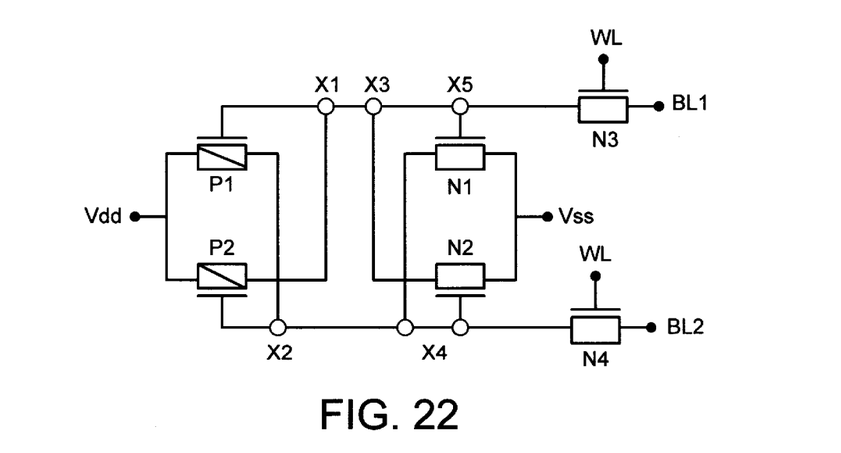
FIG. 22 is a circuit diagram of an SRAM formed using the preferred contacts.

Turning now to FIGS. 21 and 22, an application for the preferred embodiment is illustrated. In particular, a six transistor static random access memory (SRAM) cell is illustrated as it would be formed on a wafer in FIG. 21, with a corresponding circuit diagram illustrated in FIG. 22. For clarity, the silicide or studs used to connect the gate stacks to adjacent diffusions have not been illustrated, but would preferably be formed to create contacts in those places where the sidewall spacers have been removed. The exemplary SRAM design uses six transistors including two p-channel FETs (P1 and P2) and four n-channel FETs (N1, N2, N3, and N4), with N3 and N4 connecting the cell to the wordline and the two bitlines (BL1 and BL2). The transistors are formed using two gate stacks 2102 and 2104, with selective portions of the sidewall spacers 2106 and 2108 removed where contacts are to be formed. The transistors are formed in 5 active areas 2110, 2112, 2114, 2116 and 2118 that have been doped appropriately.

The exemplary SRAM design uses five contacts formed in accordance with the preferred embodiments (X1, X2, X3, X4 and X5). In particular, contact X1 connects the gate of P1 to a source/drain of P2. Likewise, contact X2 connects the gate of P2 to a source/drain of P1. Contact X3 connects the gate of N1 to a source/drain of N2. Contact X4 connects the gate of N2 to a source/drain of N1 and to a source/drain of N4. Contact X5 connects the gate of N1 to a source/drain of N3.

Thus, by using contacts in accordance with the preferred embodiment, a high density and high performance SRAM design can be fabricated.

While the invention has been described in terms of two embodiments, one skilled in the art will realize that variation may be made to the embodiments described above without departing from the invention. For example, the two embodiments may be combined, such that both silicide and tungsten studs are used to electrically connect polysilicon stacks to doped regions of the substrate. While the metal used to form the silicide was shown as titanium, other metals such as cobalt may be used. Additionally, while the invention was illustrated and described as being used to connect field effect transistors, other devices could also be connected using the preferred contacts.

What is claimed is:

1. A method for forming a contact between a diffusion region and a gate conductor on a substrate, the method comprising the steps of:

a) selectively removing sidewall spacers from said gate conductor where the contact is to be formed;

b) forming a silicide connecting to said gate conductor where said sidewall spacer was selectively removed and connecting to said diffusion region, said silicide forming an electrical contact between said gate conductor and said diffusion region.

2. The method of claim 1 wherein the substrate comprises a silicon on insulator substrate.

3. The method of claim 1 wherein the gate conductor comprises a polysilicon conductor layer, and wherein the step of forming silicide forms silicide on an exposed top surface of said polysilicon conductor layer.

4. The method of claim 1 wherein the step of selectively removing sidewall spacers comprises depositing and patterning photoresist to expose a portion of said sidewall spacers and etching said exposed portion of said sidewall spacers.

5. The method of claim 1 further comprising the step of forming isolation regions on the substrate, and wherein the step of forming silicide does not form silicide on said isolation regions.

6. The method of claim 1 wherein the step of forming silicide does not form silicide on the remaining sidewall spacers of the gate conductor.

7. The method of claim 1 wherein the contact is formed in an static random access memory device.

8. A method for forming a contact, the method comprising the steps of:
   a) providing a silicon on insulator substrate;
   b) forming a gate stack on said substrate, said gate stack including a polysilicon layer;
   c) forming sidewall spacers on sidewalls of said gate stack;
   d) forming diffusion regions adjacent said gate stack;
   e) selectively removing said sidewall spacers where said contact is to be formed;
   f) depositing titanium over said polysilicon layer and said diffusion regions;
   g) annealing said titanium such that titanium silicide is formed where titanium contacts said polysilicon layer and said diffusion regions; and
   h) removing unreacted portions of said titanium.

9. The method of claim 8 further comprising the step of forming isolation regions on said substrate, and wherein the step of removing unreacted portions of said titanium removes titanium from said isolation regions.

10. The method of claim 9 wherein said step of removing unreacted portions of said titanium removes titanium from remaining portions of said sidewall spacers.

11. A method for forming a contact between a diffusion region and a gate conductor on a substrate, the method comprising the steps of:
   a) selectively removing sidewall spacers from said gate conductor where the contact is to be formed;
   b) forming an interconnect stud, the interconnect stud connecting to said gate conductor where said sidewall spacer was selectively removed and connecting to said diffusion region, said interconnect stud forming an electrical contact between said gate conductor and said diffusion region.

12. The method of claim 11 wherein the substrate comprises a silicon on insulator substrate.

13. The method of claim 11 wherein the step of selectively removing sidewall spacers is performed by an etch used to define a via in which the interconnect stud is formed.

14. The method of claim 11 wherein the step of selectively removing sidewall spacers comprises depositing and patterning photoresist to expose a portion of said sidewall spacers and etching said exposed portion of said sidewall spacers.

15. The method of claim 11 wherein the contact is formed in an static random access memory device.

* * * * *